(12) United States Patent
Wobben (10) Patent No.: US 7,492,621 B2
(45) Date of Patent: Feb. 17, 2009

(54) INVERTER, METHOD FOR USE THEREOF AND WIND POWER INSTALLATION EMPLOYING SAME

(76) Inventor: Aloys Wobben, Argestrasse 19, D-26607 Aurich (DE)

( * ) Notice: Subject to any disclaimer, the term of this patent is extended or adjusted under 35 U.S.C. 154(b) by 613 days.

(21) Appl. No.: 10/497,953

(22) PCT Filed: Dec. 11, 2002

(86) PCT No.: PCT/EP02/14031

§ 371 (c)(1), (2), (4) Date: Jan. 13, 2005

(87) PCT Pub. No.: WO03/050938

PCT Pub. Date: Jun. 19, 2003

(65) Prior Publication Data

US 2005/0122692 A1    Jun. 9, 2005

(30) Foreign Application Priority Data

Dec. 13, 2001 (DE) .................. 101 61 178

(51) Int. Cl.
*H02M 1/00* (2007.01)
*H05K 7/00* (2006.01)

(52) U.S. Cl. ..................... 363/144; 361/729

(58) Field of Classification Search ........... 363/50, 363/55, 56.01, 131, 132, 144; 361/679, 728, 361/729, 746, 837; 307/112, 113, 125, 147, 307/151

See application file for complete search history.

(56) References Cited

U.S. PATENT DOCUMENTS

| 4,684,191 | A | 8/1987 | Feher et al. |
|---|---|---|---|
| 4,809,153 | A | 2/1989 | Bremer et al. |
| 4,845,589 | A | 7/1989 | Weidler et al. |
| 4,867,696 | A | 9/1989 | Demler, Jr. et al. |
| 5,132,896 | A | 7/1992 | Nishizawa et al. |
| 5,164,624 | A | 11/1992 | Desai et al. |
| 5,172,310 | A | 12/1992 | Deam et al. |
| 5,253,613 | A | 10/1993 | Bailey et al. |
| 5,365,424 | A | 11/1994 | Deam et al. |
| 5,422,440 | A | 6/1995 | Palma |
| 5,434,770 | A | 7/1995 | Dreifuerst et al. |

(Continued)

FOREIGN PATENT DOCUMENTS

DE    41 10 339    10/1991

(Continued)

OTHER PUBLICATIONS

"A New Converter/Inverter System for Windpower Generation Utilizing a New 600 Amp, 1200 Volt Intelligent IGBT Power Module", Donlon et al., Jan. 1994, pp. 1031-1042, IEEE.

(Continued)

*Primary Examiner*—Matthew V Nguyen
(74) *Attorney, Agent, or Firm*—Neil A. Steinberg (57) ABSTRACT

One aspect of the present invention concerns an inverter for converting a direct current into an alternating current. In one aspect, in order to provide an inverter which can be repaired more quickly and more reliably at the location of use, an inverter is of an at least partially modular structure, with releasably installed modules and connecting lines releasably mounted to the modules.

20 Claims, 5 Drawing Sheets

U.S. PATENT DOCUMENTS

| | | | |
|---|---|---|---|
| 5,497,289 A * | 3/1996 | Sugishima et al. | 361/709 |
| 5,517,063 A | 5/1996 | Schantz, Jr. et al. | |
| 5,579,217 A | 11/1996 | Deam et al. | |
| 5,808,240 A | 9/1998 | Czerwinski et al. | |
| 6,028,779 A | 2/2000 | Sakamoto et al. | |
| 6,097,617 A | 8/2000 | Schimanek | |
| 6,111,328 A | 8/2000 | Ota et al. | |
| 6,160,696 A | 12/2000 | Bailey et al. | |
| 6,166,937 A * | 12/2000 | Yamamura et al. | 363/141 |
| 6,212,087 B1 | 4/2001 | Grant et al. | |
| 6,249,448 B1 | 6/2001 | Regnier et al. | |
| 6,256,212 B1 | 7/2001 | Wobben | |
| 6,574,116 B2 * | 6/2003 | Moriwaki et al. | 361/782 |
| 7,046,535 B2 * | 5/2006 | Rodriguez et al. | 363/146 |
| 7,289,343 B2 * | 10/2007 | Rodriguez et al. | 363/146 |

FOREIGN PATENT DOCUMENTS

| | | |
|---|---|---|
| DE | 43 01 342 | 1/1993 |
| DE | 42 32 763 | 3/1994 |
| DE | 195 19 538 | 11/1996 |
| DE | 197 11 016 | 11/1997 |
| DE | 197 48 479 | 4/1999 |
| DE | 198 47 029 | 4/2000 |
| EP | 0 214 031 | 3/1987 |
| EP | 0 616 401 | 9/1994 |
| EP | 0 677 916 A2 | 10/1995 |
| EP | 0 942 505 | 9/1999 |
| EP | 1 466 398 | 10/2004 |
| GB | 2 214 731 | 9/1989 |
| WO | WO 90/01413 | 2/1990 |
| WO | WO 93/01648 | 1/1993 |
| WO | WO 98/04029 | 1/1998 |
| WO | WO 99/07060 | 2/1999 |

OTHER PUBLICATIONS

"Evolution of IGBT Converters for Mass Transit Applications", Bakran et al., May 2000, pp. 1930-1935, IEEE.

"Laminated Bus Bars for Power System Interconnects", Allocco, 1997, pp. 585-589, IEEE.

"Design and Control of a Wind Power Station With Double Fed Induction Generator", Dittrich et al., 1997, pp. 2.723-2.728, EPE 1997.

Schematic of 1200V SKiP/4-fold/DC-vertical, 2200uF/450V, SEMIKRON Electronik GmbH, 1 page. Dated 1997.

"Application of a High-Power IGBT-Converter 2.2MVA/690V for a Kneader-Drive", Jakob et al., Sep. 1997, pp. 3.498-3.501, EPE 1997.

"Laminated Bus Bars for Power System Interconnects", Allocco, May 1998, pp. 5/1-5/7, IEEE.

"Electric Vehicle Motor Controller Design, Construction and Testing", Kennedy et al., Sep. 2000, 5 pages, Australasian Universities Power Engineer Conf., Innovation for Secure Power Avpec 2000.

"Applikationshandbuch IGBT- und MOSFET-Leistungsmodule", Nicolai et al., 1998, 6 pages, Semikron, Innovation and Service.

"Power Semiconductors Leistungshalbleiter", Martin, 1996, 7 pages, Semikron Innovation and Service.

"Partners in Power", Martin, 1999, 8 pages, Semikron Innovation and Service.

"Innovative Medium Voltage Drives", 2000, 6 pages, Alstom.

"310 kVA . . . 3050 kVA", Cegelec AEG Anlagen und Antriebssysteme GmbH, 1997, 35 pages, Betriebsanleitung Alspa MD2000.

"Application Manual Power Modules", Martin, 2000, 3 pages, Semikron Innovation and Service.

"Application Manual Power Modules (Enlarged Section of Power Inverter Module for the Electric Phase T)", Martin, 2000, 5 pages, Semikron Innovation and Service.

"Featured Products Technology and Trend", Sep. 1998, 96 pages, Mitsubishi Semiconductors Power Modules MOS.

"Wirkungsgrad Mit Bio-Effekt", Sonstiges, Nov. 1998, 1 page internet printout, Industrie.de.

* cited by examiner

INVERTER, METHOD FOR USE THEREOF AND WIND POWER INSTALLATION EMPLOYING SAME

RELATED INFORMATION

The present invention concerns an inverter (dc-ac converter) for converting a direct current into an alternating current. Such inverters have long been known and are used in many different situations, inter alia in wind power installations. In that respect modern inverters use semiconductor switching elements such as IGBTs which are suitably actuated to produce the alternating current. Those semiconductor switching elements are admittedly overall relatively reliable, but failure thereof is not out of the question.

In the case of inverters of a conventional structure, upon failure of such a semiconductor switching element it is replaced on site. In that situation, unintended and unwanted fouling and/or damage and/or fitting errors can occur, which remain unnoticed and which in a short time result in (re-newed) destruction of the semiconductor switching element. The repair procedure which is thus required once again involves expenditure which would have been avoidable.

SUMMARY OF THE INVENTION

Therefore the object of an aspect of the present invention is to provide an inverter which reduces or avoids those disadvantages.

In one aspect, in an inverter of the kind set forth in the opening part of this specification, that object is attained by an at least partly modular structure, with releasably installed modules and connecting lines releasably mounted to the modules. In that respect, an aspect of the invention is based on the realization that repair on site is naturally more susceptible to error than repair in a workshop which is specifically set up for that purpose. Therefore repair on site is limited to identifying the defective module, removing it, and replacing it by a faultless module. Besides the reduced level of susceptibility to error of the repair operation in itself, replacement is to be effected, if the modules are of a suitable design configuration, more quickly than repair, so that the inverter can be more rapidly brought back into operation again.

In a preferred embodiment of an aspect of the invention modularization is directed to the function of a module so that, upon the occurrence of a fault, it is already possible to infer from the fault a specific module and at least a small number of modules which are then still to be checked.

In a particularly preferred development of an aspect of the invention the inverter further includes an intermediate storage means which is formed from a plurality of capacitors and to which at least some of the modules are connected. If those modules which are connected to the intermediate storage means are the semiconductor switching element modules, the intermediate storage means is in a position to compensate for fluctuations as a consequence of the switching procedures of the semiconductor switching elements, and thus to permit stable operation of the semiconductor switching elements.

In a particularly advantageous development of an aspect of the invention the connection between the intermediate storage means and at least some of the modules is capacitive. That capacitive configuration of the connection provides that it is possible for the influences of parasitic inductances which are inevitable in connecting lines to be reduced to a minimum. In that way it is also possible to avoid operational faults and disturbances which are to be attributed to the effect of such inductances.

In order to eliminate inductive influences to the greatest possible extent, the capacitive connection in an inverter according to an aspect of the invention particularly preferably includes at least one plate capacitor and the modules are mechanically connected to the plates of that plate capacitor.

In a preferred development of an aspect of the invention the plates of a plate capacitor form a mechanical and electrical connection between the intermediate storage means formed from a plurality of capacitors, and the connected modules. It is possible in that way to reduce the influence of inductances to the greatest possible extent.

In a particularly advantageous development of an aspect of the invention the spacing of the output terminals of the semiconductor switching elements of a module does not exceed a predetermined magnitude. In that way the lines connected thereto are also at a corresponding spacing. In that fashion those adjacent lines can pass through a common measuring transducer and thus the complication and expenditure involved for detecting the current flowing in the lines is limited.

Advantageous developments of the invention are recited in the appendant claims.

BRIEF DESCRIPTION OF THE DRAWINGS

An embodiment of aspects of the invention is described in greater detail hereinafter with reference to the Figures in which.

DETAILED DESCRIPTION

Figure 1:
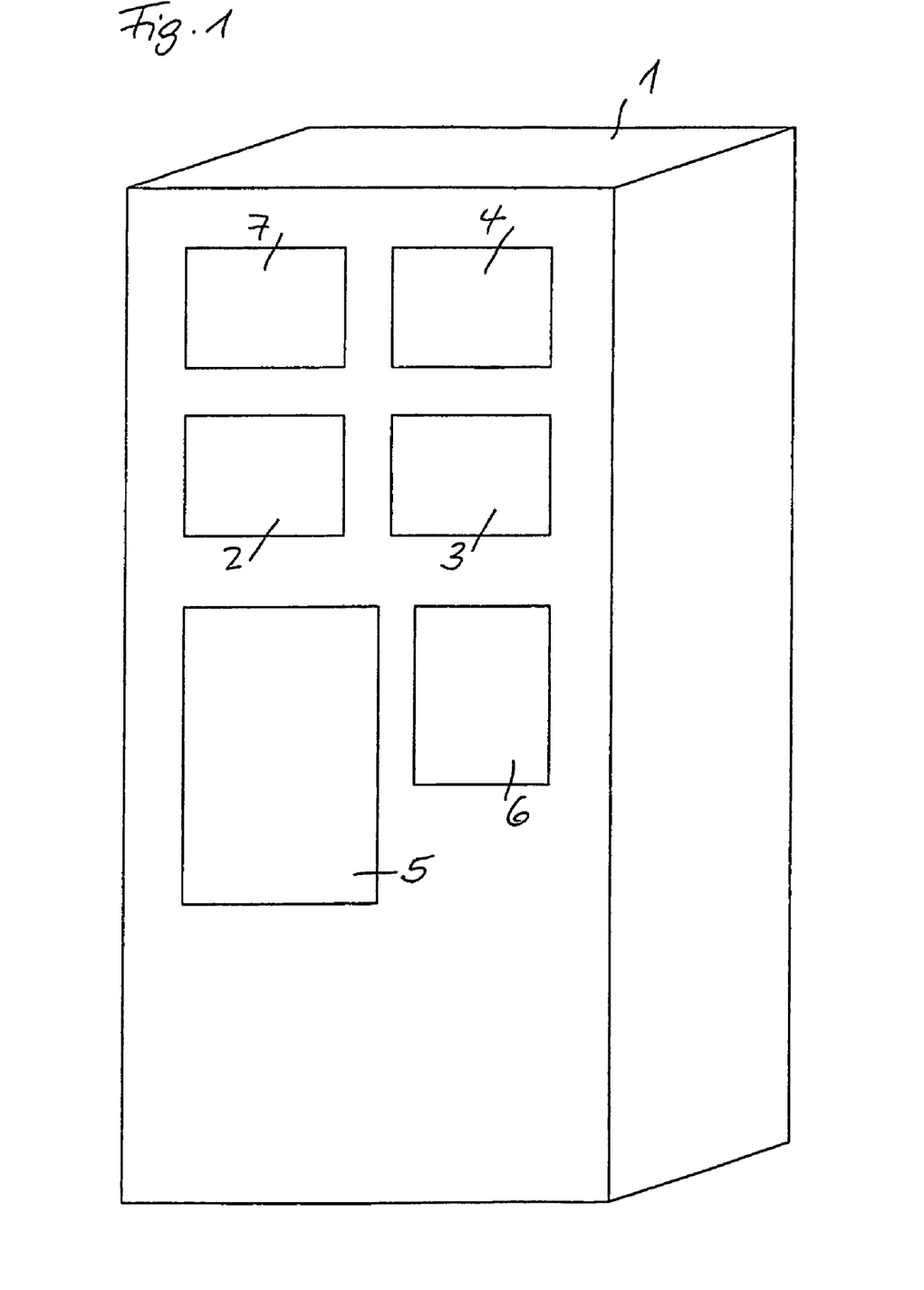
FIG. 1 shows a simplified view of an inverter according to one aspect of the invention.

FIG. 1 shows a simplified view of an inverter according to one aspect of the invention. This Figure does not show components such as chokes, relays, safety devices and the like but also cables, in order to improve the clarity of the drawing. The inverter is disposed in a cabinet 1 and has a plurality of modules. Those modules perform different functions. Thus, the modules 2, 3 and 4 are semiconductor modules which produce an alternating current from a direct current. In that respect, provided for each phase is a specific module at 2, 3 and 4. A further module 5 is provided for controlling all modules of the inverter according to the aspect of the invention. A module 6 is a voltage balancing device. Further modules 7 can also be provided. They can perform the function of a chopper, a step-up booster device or the like.

Those modules 2, 3, 4, 5, 6, 7 are installed in a cabinet 1 which is already prepared in a particular manner for the installation of modules. Extending between the modules 2, 3, 4, 5, 6, 7 are cable connections (not shown) which preferably connect the individual modules together by way of plug connections. The modules 2, 3, 4, 5, 6, 7 themselves are fixed releasably in the cabinet 1, for example with screws.

Therefore, to exchange a module 2, 3, 4, 5, 6 or 7, it is only necessary to withdraw the cable at that module and to release the screw connections of the module. Then, each individual one of the modules 2, 3, 4, 5, 6, 7 can be separately replaced in that way. In the case of a fault therefore the service engineer only has to fit a suitable replacement module in place of the module which has been recognised as being defective, and the inverter can be brought back into operation again after a short repair time.

Figure 2:
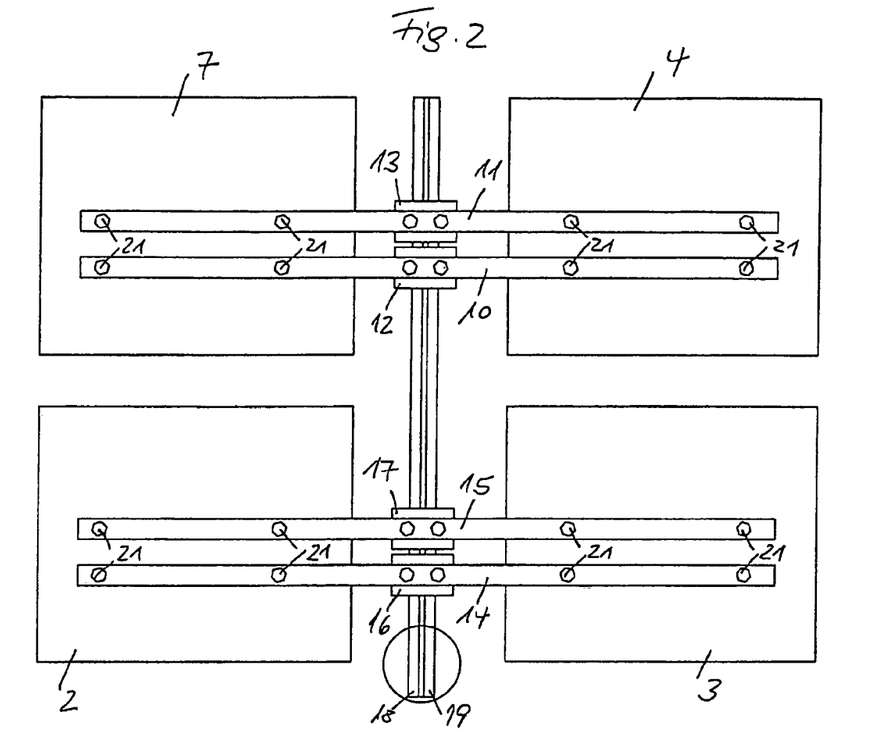
FIG. 2 shows a selection of modules from FIG. 1.

FIG. 2 shows in particular the connection of the modules 2, 3, 4 and 7 to the dc circuit of the inverter. It has already been explained with reference to FIG. 1 that the modules 2, 3 and 4 are semiconductor modules which produce for a respective phase an alternating current from a direct current. The switching elements used can be for example thyristors or IGBTs or other semiconductors. In order to feed direct current to those modules 2, 3, 4, 7, the arrangement has connecting plates 12, 13, 16, 17 to which the modules 2, 3, 4, 7 are connected. That connection is made by way of bars 10, 11, 14, 15 which are mounted on the one hand to the connecting plates 12, 13, 16, 17 and on the other hand to the modules 2, 3, 4, 7 by screws 21. The bars 10, 11, 14, 15, like the connecting plates 12, 13, 16, 17, are separated in accordance with potentials. In the present embodiment for example plates 12 and 16 can be anodes and thus involve a positive potential and the plates 13 and 17 can be cathodes and accordingly involve a negative potential or also ground potential. It will be appreciated that in that case the bars 10 and 14 are correspondingly at positive potential and the bars 11 and 15 are at negative or ground potential.

The use of bars 10, 11, 14, 15 for feeding electrical power to the modules 2, 3, 4, 7 means that correspondingly high currents can flow as the cross-section of the bars can be correspondingly large. To improve handleability, the bars 10, 11, 14, 15 can be divided so that a respective separate bar 10, 11, 14, 15 extends from a connecting plate to a module 2, 3, 4, 7.

As can be seen from FIG. 2 disposed behind the connecting plates 12, 13, 16, 17 are further plates 18, 19 in mutually parallel relationship. The arrangement and the mode of operation of those plates 18, 19 will be described in greater detail with reference to FIG. 3. In that respect FIG. 3 is a view on an enlarged scale of the portion enclosed by a circle in FIG. 2.

Figure 3:
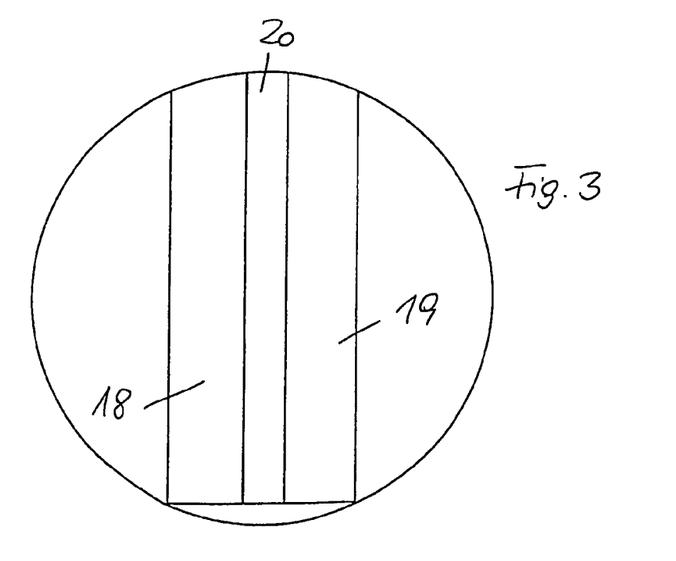
FIG. 3 shows a detail on an enlarged scale from FIG. 2.

FIG. 3 shows a 3-layer structure. That 3-layer structure is formed from two capacitor plates 18, 19 and a dielectric 20. Accordingly that structure forms a plate capacitor. In this case the plates 18, 19 of the capacitor can be produced for example from aluminium and may be of a thickness of several millimeters. The dielectric 20 can be formed by a plastic film or sheet and can be of a thickness of some tenths of a millimeter. With this structure, one of the plates 18, 19 is necessarily the anode plate and the other plate is then inevitably the cathode plate. The plates 18, 19 of the capacitor are used to feed direct current to the modules 2, 3, 4, 7. By virtue of the fact that the feed means is in the form of a plate capacitor, that feed is purely capacitive and the influence of unwanted inductances is avoided. If the capacitor plate 18 is the cathode plate, the connecting plates 13 and 17 are connected to that capacitor plate 18. In a corresponding manner the connecting plates 12 and 16 are connected to the capacitor plate 19 acting as an anode plate.

Figure 4:
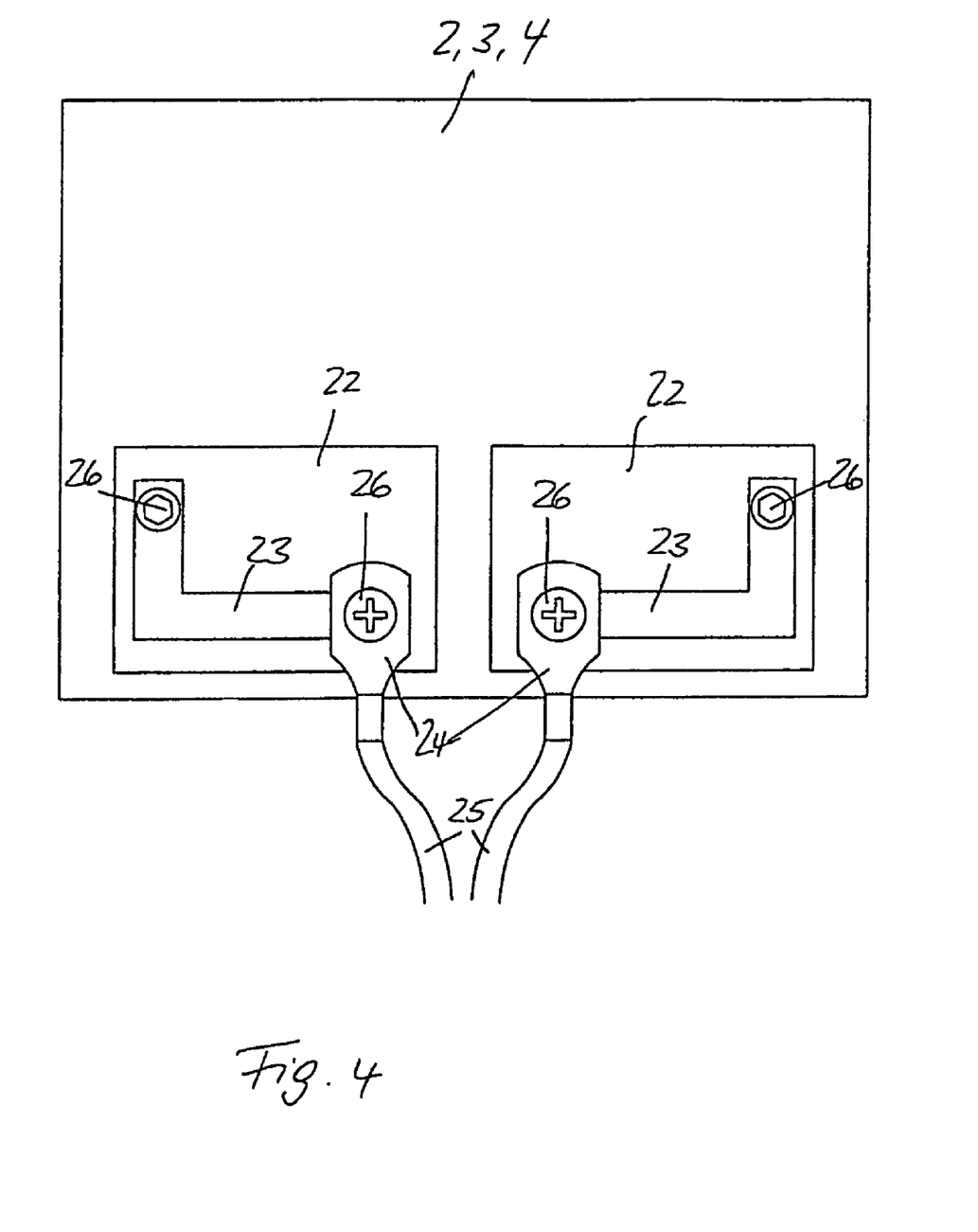
FIG. 4 shows a simplified view of a semiconductor module.

FIG. 4 shows a simplified view of a semiconductor module 2, 3, 4, more specifically with the semiconductor switching elements 22. Those semiconductor switching elements 22 for which for example IGTBs are used are actuated in a suitable manner known from the state of the art in order to produce a desired alternating current which is taken off by way of cables 25. The mode of operation of such a semiconductor module can be found for example from patent specification DE 197 48 479 C1.

In order to limit the spacing between cables 25 provided with the cable terminal lugs 24 and therewith naturally also between the cables 25 to a predetermined dimension, semiconductor switching elements 22 can be provided with suitably arranged connecting terminals. Alternatively, bars 23 are provided from the output terminals of the semiconductor modules 22 to the cable connecting lugs 24, the bars 23 passing the output current of the semiconductor element 22 to a corresponding cable 25. The bars 23 are fixed to the output terminal of the semiconductor module 22 by screws 26 which are shown here in the form of screws with a hexagonal recess in the head, and the cables 25 are in turn fixed to the bars 23 by means of cable connecting lugs 24 and screws 26 which are illustrated in the form of cross-headed screws. That arrangement makes it possible for the two cables 25 to be passed for example jointly through a measurement value pick-up device such as a ferrite ring of a current transformer in order to monitor the flow of current in the cables 25.

Figures 5, 7:
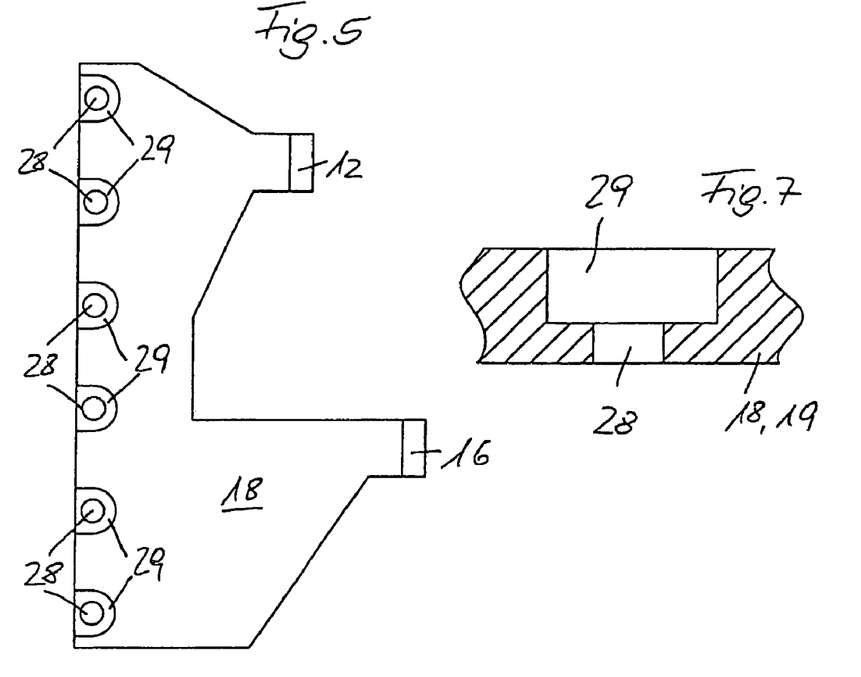
FIG. 5 shows a side view of a capacitor plate.
FIG. 7 shows a detail of the capacitor plate.
Figure 6:
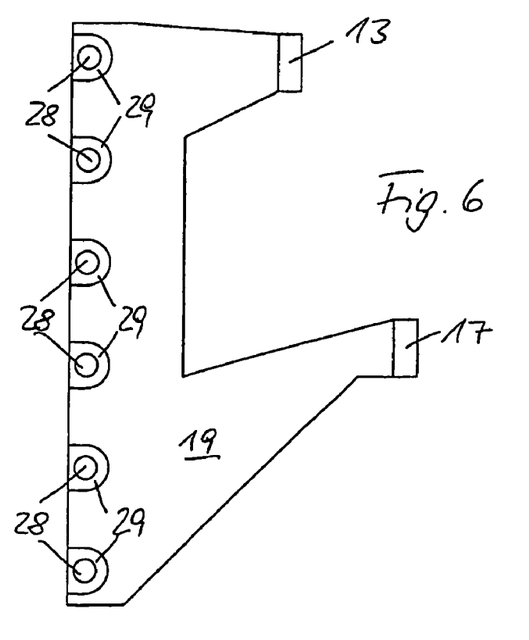
FIG. 6 shows a view on to a further capacitor plate.

In accordance with one aspect of the invention the inverter has an intermediate storage means formed from a plurality of capacitors. The purpose of that intermediate storage means is inter alia to smooth the dc voltage applied to the semiconductor modules and to compensate for voltage fluctuations as a consequence of the switching procedures of the semiconductor switching elements 22. For that purpose that intermediate storage means (not shown) is connected by way of the plate capacitor 18, 19, 20 to the modules. The plates 18, 19 of the plate capacitor are shown in FIGS. 5 and 6. In that respect FIG. 5 shows the anode plate and FIG. 6 shows the cathode plate. Those plates 18, 19 have bores 26 and recesses 29 extending around those bores. That is shown in detail in a cross-sectional view by way of the example of a bare/recess in FIG. 7.

By virtue of that arrangement, it is possible on the one hand to connect the capacitors (not shown) forming the intermediate storage means to the plates 18, 19 by screw means so that, if required, individual capacitors can also be replaced, and, by virtue of the sunk arrangement of the screw head in the recess 29, to arrange the plates in mutually juxtaposed relationship separated from each other only by the spacing of the dielectric (reference 20 in FIG. 3). A comparison of the plates shown in FIGS. 5 and 6 already shows that the connecting plates 12, 13, 16, 17 for the connecting bars are in displaced relationship with each other in respect of height, thus affording the staggered arrangement already shown in FIG. 2.

Figure 8:
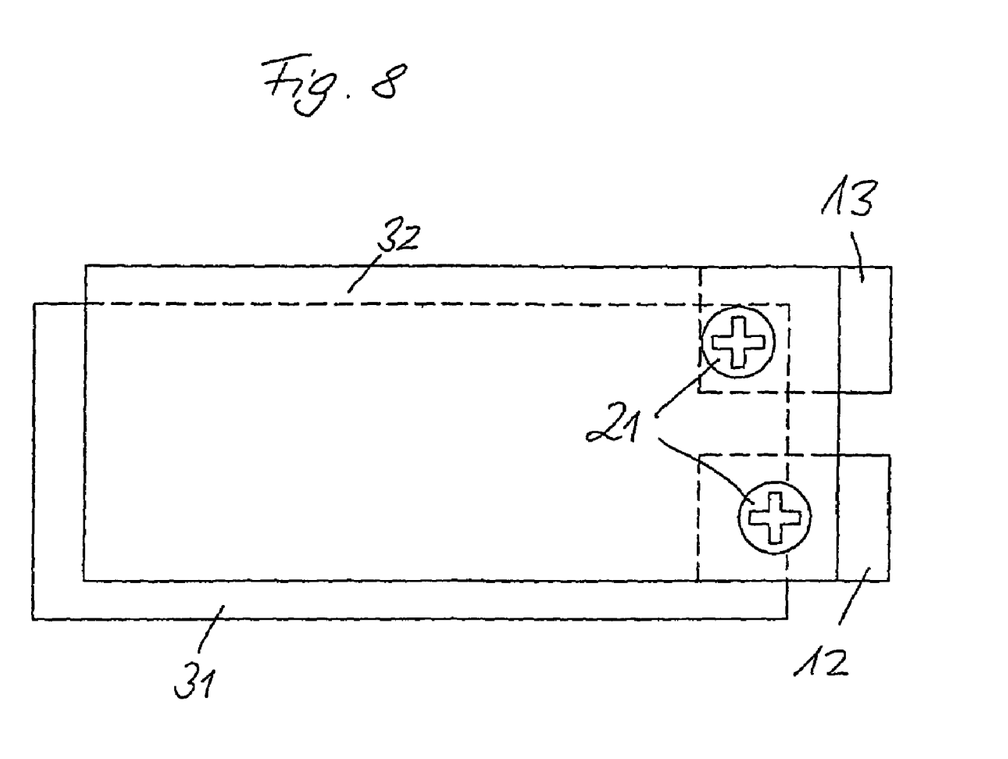
FIG. 8 shows an alternative embodiment to FIG. 2.

FIG. 8 shows an alternative arrangement to the connecting bars 10, 11, 14, 15 shown in FIG. 2. For that purpose the bars are broadened in such a way that they cover over both connecting plates 12, 13. These bars which are also shown in plate form in this Figure are identified here by references 31 and 32. In order to make it clear that they are in mutually superposed relationship, they are illustrated as being displaced relative to each other. In situ they are disposed in substantially aligned relationship one above the other.

In this case, one of the plates is connected to the anode 12 and the other to the cathode 13. These plates 31, 32 also form a capacitor, by virtue of a dielectric which is inserted between the plates 31, 32 but which is not shown in the Figure. In accordance with the view in this Figure, the plate 32 is the anode plate and the plate 31 is the cathode plate. It will be appreciated that these plates are once again suitably connected to the semiconductor modules which are also not shown in this Figure, in order to feed them with the required direct current. As therefore the connecting plates 12, 13 are also connected to the semiconductor modules by way of a plate capacitor, inductive influence is also prevented on this portion of the electrical connection.

This therefore involves a capacitive connection from the intermediate storage means to the input terminals of the semiconductor modules.

The invention claimed is:

1. An inverter having a plurality of phases, the inverter comprising:
   a first plurality of releasably installed modules wherein the first plurality of releasably installed modules includes a first releasably installed module;
   a plate capacitor having first and second plates, wherein the plate capacitor capacitively couples the first releasably installed module to an intermediate storage;
   connecting lines releasably mounted to the modules, wherein a first connecting line electrically couples the first slate of the plate capacitor to the first releasably installed module, and wherein the first connecting line includes:
   a bar; and
   a connecting plate, wherein the bar and connecting plate mechanically and electrically couple the first plate of the plate capacitor to the first releasably installed module; and
   wherein each of the first plurality of releasably installed modules produces, for a respective phase of the inverter, an alternating current from a direct current.

2. An inverter according to claim 1 wherein the connecting lines further includes a second connecting line which electrically couples the second plate of the plate capacitor to the first releasably installed module, and wherein the second connecting line includes:
   a bar; and
   a connecting plate, wherein the bar and connecting plate of the second connecting line mechanically and electrically couple the second plate of the plate capacitor to the first releasably installed module.

3. An inverter according to claim 1 wherein:
   the first plurality of releasably installed modules further includes a second releasably installed module;
   the plate capacitor capacitively couples the second releasably installed module to the intermediate storage; and
   the connecting lines couple the first and second plates of the plate capacitor to the second releasably installed module.

4. An inverter according to claim 3 wherein:
   the first connecting line electrically couples the first plate of the plate capacitor to the second releasably installed module and the second connecting line electrically couples the second plate of the plate capacitor to the second releasably installed module; and
   the connecting lines further include third and fourth connecting lines, wherein the third connecting line electrically couples the first plate of the plate capacitor to the third releasably installed module and the fourth connecting line electrically couples the second plate of the plate capacitor to the third releasably installed module, and wherein the third and fourth connecting lines each includes:
   a bar; and
   a connecting plate, wherein the bar and connecting plate mechanically and electrically couple the respective plate of the plate capacitor to the third releasably installed module.

5. An inverter according to claim 1 wherein:
   the first plurality of releasably installed modules further includes second and third releasably installed modules;
   the plate capacitor capacitively couples the second and third releasably installed modules to the intermediate storage; and
   the connecting lines couple the first and second plates of the plate capacitor to the second and third releasably installed modules.

6. An invader according to claim 5 wherein the connecting lines further include third and fourth connecting lines, wherein the third connecting line electrically couples the first plate of the plate capacitor to the second releasably installed module and the fourth connecting line electrically couples the second plate of the plate capacitor to the third releasably installed module, and wherein the third and fourth connecting lines each includes:
   a bar; and
   a connecting plate, wherein the bar and connecting plate mechanically and electrically couple the respective plate of the plate capacitor to the second releasably installed module.

7. An inverter according to claim 1 further comprising the intermediate storage.

8. An inverter according to claim 7 wherein the intermediate storage is formed from a plurality of capacitors.

9. An inverter according to claim 1 further including a releasably installed module comprising semiconductor switching elements having spaced apart output terminals.

10. An inverter according to claim 1 further comprising a releasably installed control module to control one or more of the first plurality of releasably installed modules.

11. An invader according to claim 1 further comprising a second plurality of releasably installed modules, wherein each of the second plurality of modules performs a function for the inverter.

12. An inverter according to claim 1 further comprising a second plurality of releasably installed modules, wherein one module of the second plurality of modules performs voltage balancing.

13. An inverter according to claim 1 further comprising:
   a voltage balancing releasably installed module; and
   the intermediate storage.

14. An inverter according to claim 13 further comprising a releasably installed control module to control a plurality of the first plurality of modules.

15. An inverter according to claim 13 further comprising a releasably installed chopper or a step-up booster module.

16. An inverter according to claim 14 wherein the releasably installed chopper or a step-up booster module is connected to the intermediate storage by a capacitive connection.

17. A wind power installation comprising at least one inverter according to claim 1.

18. A wind power installation comprising at least one inverter according to claim 3.

19. A wind power installation comprising at least one inverter according to claim 4.

20. A wind power installation comprising at least one inverter according to claim 5.

* * * * *

UNITED STATES PATENT AND TRADEMARK OFFICE
CERTIFICATE OF CORRECTION

PATENT NO. : 7,492,621 B2  Page 1 of 1
APPLICATION NO. : 10/497953
DATED : February 17, 2009
INVENTOR(S) : Aloys Wobben It is certified that error appears in the above-identified patent and that said Letters Patent is hereby corrected as shown below:

In claim 1, col. 5, line 12, delete "slate" and substitute -- plate --.

Signed and Sealed this

Thirtieth Day of June, 2009

JOHN DOLL
*Acting Director of the United States Patent and Trademark Office*